(12) United States Patent
Hata et al.

(10) Patent No.: US 7,759,692 B2
(45) Date of Patent: Jul. 20, 2010

(54) SEMICONDUCTOR LIGHT EMITTING DEVICE

(75) Inventors: Toshio Hata, Mihara (JP); Hisayuki Shinohara, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/365,672

(22) Filed: Feb. 4, 2009

(65) Prior Publication Data

US 2009/0194782 A1 Aug. 6, 2009

(30) Foreign Application Priority Data

Feb. 6, 2008 (JP) ............................. 2008-026694

(51) Int. Cl.
*H01L 33/00* (2010.01)
*H01L 21/00* (2006.01)
(52) U.S. Cl. ........................................ 257/100; 438/22
(58) Field of Classification Search ........... 257/99–100, 257/680, E33.001–E33.077; 438/22, 116; 362/27, 227
See application file for complete search history.

(56) References Cited

U.S. PATENT DOCUMENTS

| 7,422,338 | B2* | 9/2008 | Kono et al. | ............... | 362/27 |
| 2004/0159850 | A1 | 8/2004 | Takenaka | | |
| 2007/0247841 | A1 | 10/2007 | Kono et al. | | |
| 2008/0230790 | A1* | 9/2008 | Seko et al. | ............... | 257/89 |

FOREIGN PATENT DOCUMENTS

| CN | 1523681 | 8/2004 |
| JP | 62-47156 | 3/1987 |
| JP | 2004-071675 | 3/2004 |

OTHER PUBLICATIONS

Seko et al., U.S Office Action mailed on Jul. 8, 2009 directed at related U.S. Appl. No. 12/053,356; 12 pages.
Seko et al., U.S. Office Action mailed Jan. 13, 2010, directed to related U.S. Appl. No. 12/053,356; 5 pages.

* cited by examiner

*Primary Examiner*—Calvin Lee
(74) *Attorney, Agent, or Firm*—Morrison & Foerster LLP

(57) ABSTRACT

A silver-plated metal member region on which a light emitting element is disposed, an extraction electrode having a copper plate pattern, and a convex resin portion separating the metal member region into a plurality of sections are provided on the bottom surface of a concave portion in a package of a semiconductor light emitting device. A covering resin is partially formed on the metal member region and a sealing resin is placed to cover the metal member region, the covering resin and the convex resin portion. According to this configuration, the area of contact is decreased between the sealing resin and the metal member region having the light emitting element placed thereon, to thereby prevent the light emitting element from falling off and being displaced from the metal member region, with the result that a semiconductor light emitting device of high reliability can be provided.

19 Claims, 6 Drawing Sheets

SEMICONDUCTOR LIGHT EMITTING DEVICE

This nonprovisional application is based on Japanese Patent Application No. 2008-026694 filed on Feb. 6, 2008, with the Japan Patent Office, the entire contents of which are hereby incorporated by reference.

BACKGROUND OF THE INVENTION

1. Field of the Invention

The present invention relates to a semiconductor light emitting device using a light emitting diode and the like.

2. Description of the Background Art

In the conventional surface-mount light emitting diode, as shown in FIG. 6, a plurality of light emitting elements 102 are arranged within a concave portion 101 of a package 100, and a plurality of lead electrodes 103 having light emitting elements 102 placed thereon, respectively, are arranged so as to be aligned in the longitudinal direction of package 100. A lead electrode 104 for wire bonding is disposed on the end of package 100 in the longitudinal direction located outside of lead electrode 103. Light emitting elements 102 are placed on different lead electrodes 103a, 103b and 103c, respectively, and the bottom surface of concave portion 101 in package 100 made of resin is exposed between light emitting element 102 and lead electrode 104. The exposed bottom surface of concave portion 101 closely adheres to the mold member (not shown) filled in concave portion 101. Light emitting elements 102 each are connected to the outside electrically independent of each other (for example, see Japanese Patent Laying-Open No. 2004-071675).

In the case of the configuration of the light emitting diode as shown in Japanese Patent Laying-Open No. 2004-071675, when lead electrode 103 is increased in area in order to improve heat dissipation, there is a problem that the light axis of light emitting element 102 may be displaced or light emitting element 102 may fall off. The reason thereof will be explained below. Light emitting element 102 placed on lead electrode 103 is also in contact with the sealing member provided for sealing. This sealing member is different in thermal expansion coefficient from lead electrode 103 made of metal material. This causes a significant difference in the rates of expansion by heating and shrinkage by cooling between the sealing member and lead electrode 103. Consequently, light emitting element 102 may be displaced from lead electrode 103, causing displacement of the light axis of the element or falling off of the element.

Furthermore, lead electrodes 103 and 104 are generally silver-plated. The potential difference between these electrodes and the moisture adsorbed into the surface from the ambient atmosphere cause migration of the silver plating in each of the silver-plated lead electrodes. This also produces a problem that the lead electrodes cause an electrical short circuit leading to malfunctions such as lighting failure of the light emitting element.

SUMMARY OF THE INVENTION

An object of the present invention is to provide a semiconductor light emitting device exhibiting sufficient reliability in which the area of contact between the sealing resin for sealing and the metal member region having the light emitting element placed thereon is reduced, to thereby prevent falling off and displacement of the light emitting element from the metal member region resulting from the difference in the thermal expansion coefficient between the sealing resin and the metal member region.

The semiconductor light emitting device of the present invention for solving the above-described problems includes a package; a light emitting element placed on a predetermined surface of the package; a metal member region provided on the predetermined surface of the package, the light emitting element being disposed on the metal member region; an extraction electrode provided on the predetermined surface of the package and connected by a wire with an electrode of the light emitting element; a convex resin portion provided on the predetermined surface of the package to separate the metal member region into a plurality of sections; a covering resin formed on the metal member region; and, on the predetermined surface of the package, a sealing resin covering the metal member region, the covering resin and the convex resin portion. At least the convex resin portion and the covering resin are in contact with the sealing resin. The predetermined surface of the package can be configured of a bottom surface of a concave portion provided in the package.

An embodiment of the present invention provides a structure as described below. The convex resin portion is absent below the wire electrically connecting the light emitting element and the extraction electrode. Furthermore, the covering resin may be formed to continuously extend from an end of the bottom surface of the concave portion in the package. The covering resin may be formed on a surface of the extraction electrode. The resin forming the package and the covering resin may be made of the same material.

Another embodiment of the present invention provides a structure as described below. The electrode plane on which the light emitting element is mounted or the extraction electrode is formed on one side of the bottom surface of the concave portion. Furthermore, mount surfaces of a plurality of light emitting elements or a plurality of extraction electrodes are separated from each other by the convex resin portion. The covering resin may be formed around the connection to the wire on the extraction electrode. The resin forming the package and the sealing resin include at least one selected from a group consisting of polyphthalamide (PPA), polycarbonate resin, polyphenylene sulfide (PPS), liquid crystal polymer (LCP), ABS resin, epoxy resin, phenol resin, acrylic resin, PBT resin, and silicone resin.

According to the present invention, since the convex resin portion is provided which separates the metal member region provided on the predetermined surface of the package into a plurality of sections, the light emitting elements are disposed on the metal member regions, respectively, to allow the heat generated during the light emission of the light emitting element to escape to the outside through an independent passage. Thus, the heat dissipation performance is well maintained even when a large current is supplied, with the result that the characteristics of the light emitting element can be maintained and the deterioration of the sealing resin can be suppressed. Furthermore, since the area of contact between the extraction electrode and the sealing resin can be reduced, the light emitting element can be prevented from falling off or being displaced from the extraction electrode, and therefore, a light emitting diode of sufficient reliability can be provided. Furthermore, the convex resin portion serves as a barrier against silver migration, allowing prevention of electrical short circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
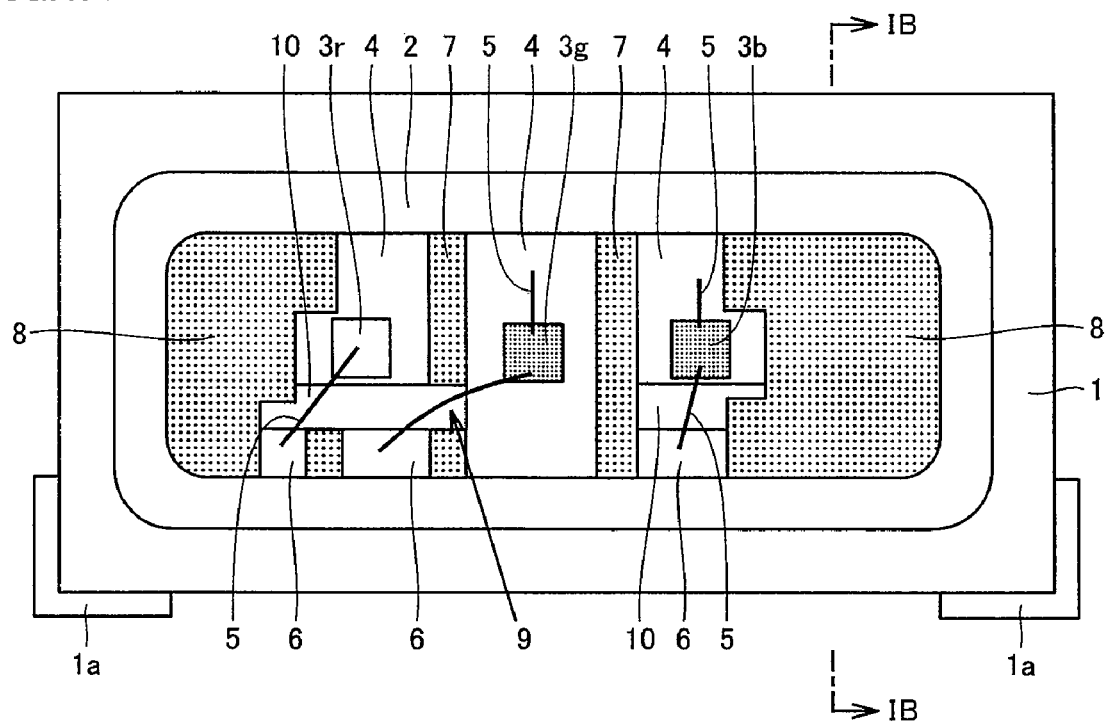
FIG. 1A is a diagram of a light emitting face corresponding to one side of a semiconductor light emitting device according to a first embodiment of the present invention.
Figure 1B:
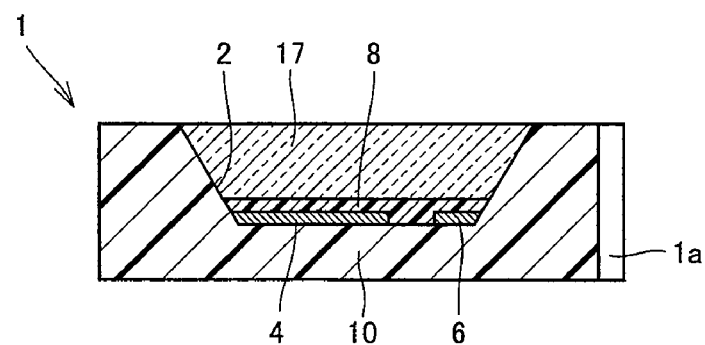
FIG. 1B is a cross sectional view taken along lines IB-IB in FIG. 1A.

The semiconductor light emitting device according to the first embodiment of the present invention will be described with reference to FIGS. 1A and 1B. FIG. 1A is a diagram of a light emitting face corresponding to one side of a side-view type surface-mount light emitting diode as a semiconductor light emitting device according to the first embodiment of the present invention. FIG. 1B is a cross sectional view taken along lines IB-IB in FIG. 1A. FIGS. 1A and 1B each show a package 1 having a concave portion 2 formed on its light emitting face. Concave portion 2 forms an opening in which a light emitting element is placed, and the light emitting element is placed in this concave portion 2. The light emitting element includes a red light emitting element 3r, a blue light emitting element 3b and a green light emitting element 3g. These light emitting elements are arranged on the bottom surface of concave portion 2 in package 1 so as to be aligned in the longitudinal direction of concave portion 2 at the midpoint of the length in the vertical direction.

On the bottom surface of concave portion 2 in package 1, further placed is a silver-plated metal member region 4 on which the light emitting element is disposed. Furthermore, on the lower side of concave portion 2 in package 1, a plurality of extraction electrodes 6 each having a silver-plated copper plate pattern are placed separately from one another by a convex resin portion 7 having, for example, a height of approximately 10 μm and a width of approximately 90 μm. This extraction electrode 6 is connected with the electrode (not shown) of the light emitting element by a conductive wire 5. Convex resin portion 7 separating metal member region 4 into a plurality of sections, a covering resin 8 formed on metal member region 4, and a sealing resin (not shown because the resin is transparent) covering metal member region 4 are further arranged in concave portion 2. Convex resin portion 7 and covering resin 8 are in contact with a sealing resin 17. Furthermore, the convex resin portion is not formed below wire 5 electrically connecting light emitting element 3 and extraction electrode 6 (area indicated by an arrow 9), and a part of resin 10 in package 1 is exposed on the bottom surface of concave portion 2 in package 1.

Resin 10 forming package 1, covering resin 8 and sealing resin 17 are formed by the same resin material. The inclined surface on the inner periphery of concave portion 2 in package 1 is subjected to mirror-finishing by plating with aluminum or silver to provide a mirror finished surface.

It is to be noted that covering resin 8 is formed to the vicinity of red light emitting element 3r and blue light emitting element 3b so as to cover a part of each of metal member region 4 and extraction electrode 6 from the bottom of the inclined surface on each end of concave portion 2 in the longitudinal direction. In other words, covering resin 8 is formed to extend to the continuous region so as to cover a part of a metal portion (electrode portion and the like) from the bottom surface of concave portion 2 in package 1.

Package 1 is formed by punching a silver-plated copper plate containing iron by a mold, patterning the metal portion having a desirable shape, sandwiching the upper and lower surfaces of the metal portion by the mold, and pouring polyphthalamide (PPA) into the mold to be cured. In this way, extraction electrode 6 is integrally formed with the cured resin to form a surface-mount package 1.

The light emitting element will then be described. The light emitting element includes a blue light emitting element 3b having an InGaN semiconductor which emits blue light having a dominant wavelength of about 470 nm, a green light emitting element 3g having an InGaN semiconductor which emits green light having a dominant wavelength of about 525 nm, and a red light emitting element 3r having an AlInGaP semiconductor which emits red light having a dominant wavelength of about 630 nm. The light emitting elements each are die-bonded to extraction electrode 6 (mount surface) using silver paste for red light emitting element 3r emitting red light, in which an electrode is first formed on both surfaces of the light emitting element. After the silver paste bonding red light emitting element 3r and extraction electrode 6 is cured, epoxy resin is used for bonding of blue light emitting element 3b and green light emitting element 3g each having a bottom surface made of a sapphire substrate. Furthermore, wire 5 made of a gold wire is used for connecting the electrode formed on each of light emitting elements 3r, 3b and 3g to extraction electrode 6. The sealing resin (not shown) made of silicone resin is filled in concave portion 2 of package 1 for sealing and is then cured. After the sealing resin is cured, an external electrode 1a protruding to the outside is bent by the mold along the surface from which the extraction electrode of package 1 protrudes, and is then separated into a plurality of parts. In this way, a light emitting diode capable of emitting light such as white, blue, red, and green light with high luminance and high output is obtained.

It is to be noted that convex resin portion 7 is not formed below wire 5 in the figure (area indicated by an arrow 9 in the figure). This is because, in the case where light emitting elements 3r, 3b and 3g are connected by wires 5 to extraction electrodes 6, respectively, no convex resin portion 7 formed below wire 5 makes it easier to carry out the bonding of wire 5.

As a material of package 1, polyphthalamide (PPA), polycarbonate resin, polyphenylene sulfide (PPS), liquid crystal polymer (LCP), resin such as ABS resin, epoxy resin, phenol resin, acrylic resin, and PBT resin, or ceramic is used. Package 1 is formed by curing the molten material that is poured through the gate located on the underside of the package into the mold which is closed by a plurality of positive and negative extraction electrodes 6 being inserted.

Transparent resin which is excellent in weather resistance such as epoxy resin, silicone resin, acrylic resin, and urea resin, or glass is suitably used for translucent resin used as sealing resin. The translucent resin containing a diffusing agent allows the directivity from the light emitting element to be reduced and the viewing angle to be increased. Furthermore, the translucent resin used as sealing resin may be resin containing phosphor. The sealing resin may have an approximately hemispherical shape or an approximately cylindrical shape.

In the above-described embodiments, metal member regions 4 corresponding to the mount surfaces of the plurality of light emitting elements 3r, 3b and 3g are separated by convex resin portion 7, which causes a reduction in the area of each of metal member regions 4 on which light emitting elements 3r, 3b and 3g are disposed, respectively. Consequently, the area of contact between metal member region 4 and the mold member of the sealing resin is reduced to thereby mitigate the effects of expansion and shrinkage of the metal material. Furthermore, between the extraction lead electrodes, resin 10 is exposed on the bottom surface of concave portion 2 in package 1 made of resin. The exposed area of resin 10 in package 1 is increased to thereby allow an increase in the adhesive strength between the resins. Accordingly, it becomes possible to prevent the light emitting element from being displaced and falling off from the extraction lead electrode or metal member region 4 on which the light emitting element is disposed.

Furthermore, since the area of metal member region 4 on which the light emitting element is disposed is decreased, the area of contact between the covering resin and the sealing resin to be supplied for future sealing is increased and the area of contact between the sealing resin and extraction electrode 6 made of metal is decreased. Consequently, the light emitting element can be prevented from falling off due to the difference in the thermal expansion coefficient between the resin and the metal.

Furthermore, convex resin portion 7 serves as a barrier between extraction electrodes 6, allowing prevention of the electrode material diffusion caused by migration of the electrode-forming material which results from humidity, potential difference, and the like. Therefore, the short circuit between extraction electrodes 6 can be prevented and the reliability of the light emitting device can be maintained.

Second Embodiment

Figure 2A:
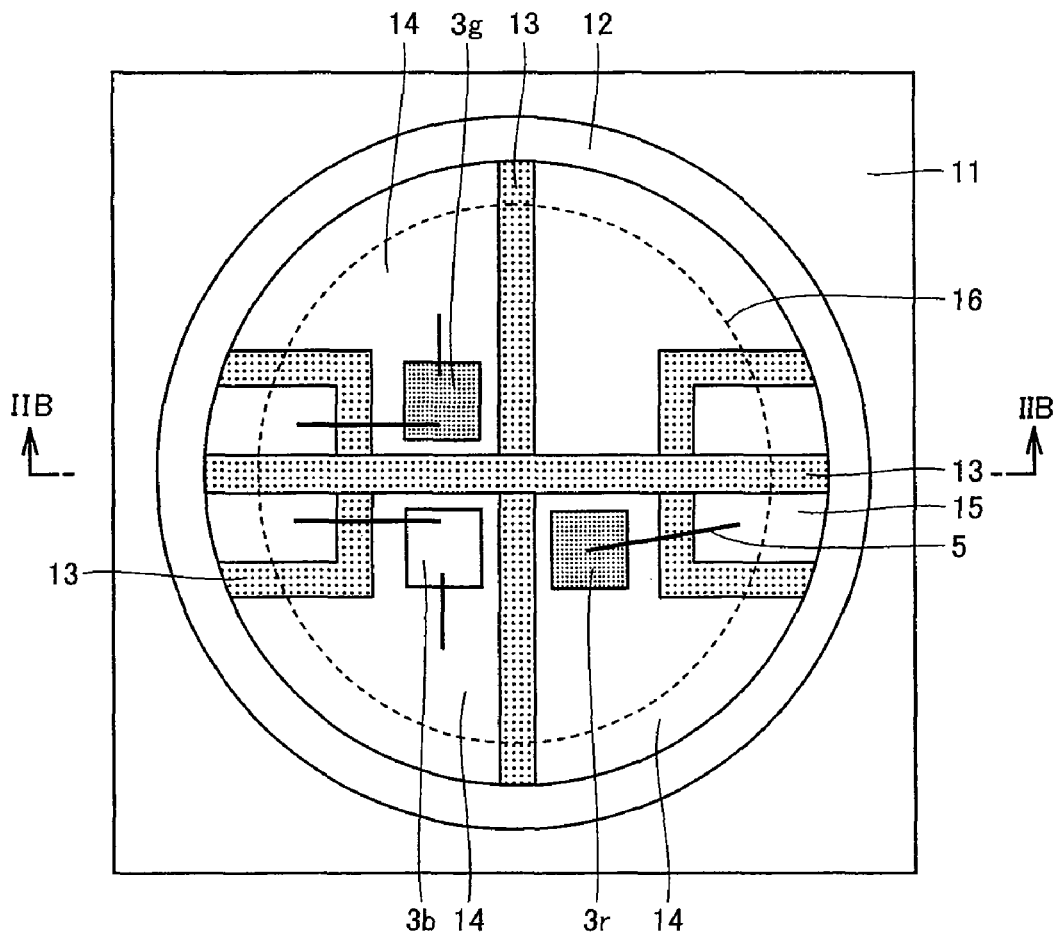
FIG. 2A is a plan view of a light emitting face of a semiconductor light emitting device according to a second embodiment of the present invention.
Figure 2B:
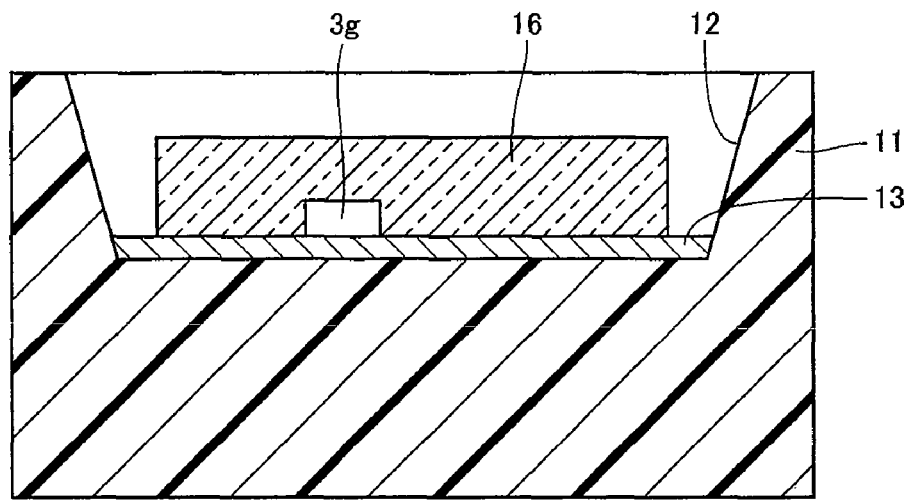
FIG. 2B is a cross sectional view taken along lines IIB-IIB in FIG. 2A.

The semiconductor light emitting device according to the second embodiment of the present invention will be hereinafter described with reference to FIGS. 2A and 2B. FIG. 2A is a plan view of a top-view type surface-mount light emitting diode as a semiconductor light emitting device according to the second embodiment of the present invention, and FIG. 2B is a cross sectional view taken along lines IIB-IIB in FIG. 2A. With regard to the semiconductor light emitting device according to the second embodiment, the same components as those in the first embodiment are designated by the same reference characters, and description thereof will not be repeated. In FIG. 2A, a light emitting element (a red light emitting element 3r, a blue light emitting element 3b, a green light emitting element 3g), a convex resin portion 13, a conductive wire 5, an extraction electrode 14 as a metal member region, and an extraction electrode 15 are provided in a concave portion 12 of a package 11.

When forming package 11, a silver-plated copper plate containing iron is first punched by a mold to form a metal plate having a patterned metal portion in the desired shape. The metal plate is then sandwiched from below and above by the lower package made of polyphthalamide (PPA) in the shape of convex resin portion 13 and the upper package made of polyphthalamide (PPA) having an opening 12 which is increased in diameter in the vertically upward direction. The upper package and the lower package are then bonded to each other and extraction electrodes 14, 15 are integrally formed with the cured resin polyphthalamide (PPA), to thereby form a surface-mount package. In this case, convex resin portions 13 are formed between a plurality of extraction electrodes 14 on which light emitting elements 3r, 3g and 3b are mounted, respectively, between a plurality of extraction electrodes 15 to which wire 5 is bonded, and between extraction electrodes 14 and 15, respectively, so as to insulatingly separate these electrodes from each other.

Package 11 has concave portion 12 as an opening in which light emitting element 3 is disposed. The silver-plated copper plate patterns are arranged as extraction electrodes 14 and 15 in concave portion 12 of package 11. Each light emitting element 3 is mounted approximately in the center of the bottom surface of concave portion 12 in package 11.

The light emitting element includes a blue light emitting element 3b having an InGaN semiconductor which emits blue light having a dominant wavelength of about 470 nm, a green light emitting element 3g having an InGaN semiconductor which emits green light having a dominant wavelength of about 525 nm, and a red light emitting element 3r having an AlInGaP semiconductor which emits red light having a dominant wavelength of about 630 nm. Each of light emitting elements 3b, 3g and 3r is die-bonded to extraction electrode 14 that is to be a mount surface thereof using the silver paste for red light emitting element 3r, in which an electrode is first formed on both surfaces of the light emitting element. After the silver paste bonding red light emitting element 3r and extraction electrode 14 is cured, silicone resin is used for bonding of blue light emitting element 3b and green light emitting element 3g each having a bottom surface made of a sapphire substrate. Furthermore, wire 5 made of a gold wire is used for connecting the electrode formed on each of light emitting elements 3b, 3g and 3r to extraction electrode 15. The sealing resin (not shown) made of silicone resin is filled in concave portion 12 of package 11 for sealing and is then cured. After the sealing resin is cured, it is separated into a plurality of products. A light emitting diode capable of emitting light such as white, blue, red, and green light with high luminance and high output is thus obtained.

Conventionally, the potential difference between the electrodes and the moisture absorbed into the surface from the ambient atmosphere cause migration of the silver plating in silver-plated extraction electrodes 14 and 15, leading to an electrical short circuit between extraction electrodes 14 and 15. As a result, malfunctions such as lighting failure of the light emitting element occur. In contrast, according to the structure of the present second embodiment, since convex resin portions 13 (diagonally shaded area in the figure) are formed between silver-plated extraction electrodes 14 and between extraction electrodes 15, convex resin portion 13 serves as a barrier against the silver migration, which allows prevention of electrical short circuit between the extraction electrodes.

It is to be noted that dashed lines in FIG. 2A show a sealing resin 16. Sealing resin 16 may have, for example, an approximately cylindrical shape as shown in FIG. 2B, a dome-like shape, or the like. In this case, one or more light emitting elements may be mounted, or, as in the present embodiment, three light emitting elements including each of red, blue and green light emitting elements may be mounted. Furthermore, four light emitting elements of the same color may be mounted to fabricate a light emitting device providing high light output.

Third Embodiment

Figure 3:
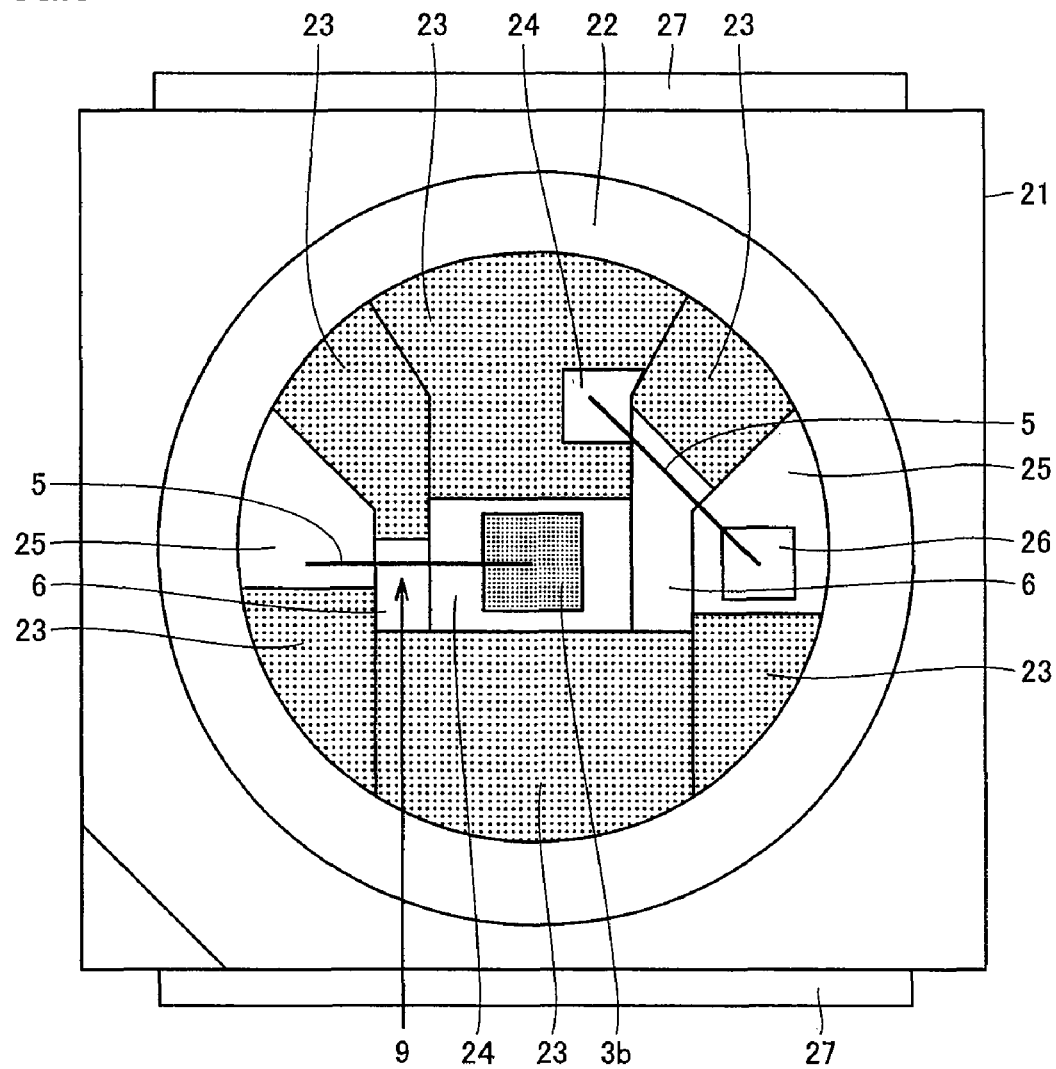
FIG. 3 is a plan view of a light emitting face of a semiconductor light emitting device according to a third embodiment of the present invention.

The semiconductor light emitting device according to the third embodiment of the present invention will be described with reference to FIG. 3. FIG. 3 is a plan view of a top-view type surface-mount light emitting diode including a zener diode as a semiconductor light emitting device according to the third embodiment of the present invention. With regard to the semiconductor light emitting device according to the third embodiment of the present invention, the same components as those in the first embodiment are designated by the same reference characters, and description thereof will not be repeated. In FIG. 3, in a concave portion 22 of a package 21, a blue light emitting element 3b, a convex resin portion 23, a conductive wire 5, an extraction electrode 24 as a metal member region, an extraction electrode 25, and a zener diode 26 are provided, which form a top-view type surface-mount light emitting diode.

When forming package 21, a silver-plated copper plate containing iron is first punched by a mold to form a metal plate having a patterned metal portion in the desired shape. The metal plate is then sandwiched from below and above by the lower package made of polyphthalamide (PPA) in the shape of convex resin portion 23 (dotted area in the figure) and the upper package made of polyphthalamide (PPA) having an opening 22 which is increased in diameter in the vertically upward direction. The upper package and the lower package are then bonded to each other and extraction electrodes 24, 25 are integrally formed with the cured resin polyphthalamide (PPA) to thereby form a surface-mount package. In this case, convex resin portions 23 are formed between extraction electrodes 24 each corresponding to the mount surface of blue light emitting element 3b and between extraction electrodes 25 each corresponding to the mount surface of zener diode 26, respectively.

Package 21 has concave portion 22 forming an opening in which blue light emitting element 3b is disposed, and the silver-plated copper plate patterns are arranged as extraction electrodes 24 and 25 in the bottom surface of concave portion 22. Blue light emitting element 3b is mounted approximately in the center of the bottom surface of concave portion 22.

In this case, an InGaN semiconductor which emits blue light having a dominant wavelength of about 470 nm is used as blue light emitting element 3b. Blue light emitting element 3b is mounted in the center on extraction electrode 24 which is a mount surface. The silver paste is used to die-bond blue light emitting element 3b to extraction electrode 24 which is a mount surface thereof. Wire 5 made of a gold wire is used for connecting the electrode formed on light emitting element 3b to extraction electrode 25. Zener diode 26 is die-bonded to extraction electrode 25 using the silver paste. Wire 5 made of a gold wire is used for connecting the electrode formed on zener diode 26 to extraction electrode 24. The sealing resin (not shown) having a weight ratio of a phosphor (Ba, Sr)$_2$SiO$_4$:Eu to the silicone resin being 1:4 is filled in concave portion 22 of package 21 for sealing and is then cured. After the sealing resin is cured, an external electrode 27 protruding to the outside is bent by the mold along the surface from which the extraction electrode of package 21 protrudes, and is then separated into a plurality of products. In this way, a light emitting diode capable of emitting white light with high luminance and high output is obtained.

As in the second embodiment, according to the third embodiment, since convex resin portion 23 is formed between silver-plated extraction electrodes 24 and 25, convex resin portion 23 serves as a barrier against the silver migration, which allows prevention of electrical short circuit between extraction electrodes 24 and 25.

The phosphor includes at least one or more types emitting yellow fluorescence and selected from a group consisting of Ca(Si, Al)$_{12}$(O, N)$_{16}$:Eu which is α-sialon obtained by activating Eu (europium); (Ba, Sr)$_2$SiO$_4$ which is BOSE:Eu family; (Y, Gd)$_3$Al$_5$O$_{12}$:Ce; and Tb$_3$Al$_5$O$_{12}$:Ce. When the phosphor is suitably mixed, a light emitting diode capable of emitting quasi-white light with high luminance and high output is obtained.

In this case, a light emitting diode capable of emitting light having light bulb color and high color rendering property with high luminance and high output is obtained by suitably mixing at least one or more types emitting green fluorescence and selected from a group consisting of (Ba, Mg)Al$_{10}$O$_{17}$:Eu, Mn; (Si, Al)$_6$(O, N)g:Eu which is β-sialon obtained by activating Eu (europium); SrAl$_2$O$_4$:Eu; Ba$_{1.5}$Sr$_{0.5}$SiO$_4$:Eu; BaMgAl$_{10}$O$_{17}$:Eu, Mn; Ca$_3$(Sc, Mg)$_2$Si$_3$O$_{12}$:Ce; Lu$_3$Al$_5$O$_{12}$:Ce; CaSc$_2$O$_4$:Ce; ZnS:Cu, Al; (Zn, Cd)S:Cu, Al; Y$_3$Al$_5$O$_{12}$:Tb; Y$_3$(Al, Ga)$_5$O$_{12}$:Tb; Y$_2$SiO$_5$:Tb; Zn$_2$SiO$_4$:Mn; (Zn, Cd)S:Cu; ZnS:Cu; Gd$_2$O$_2$S:Tb; (Zn, Cd)S:Ag; Y$_2$O$_2$S:Tb; (Zn, Mn)$_2$SiO$_4$; BaAl$_{12}$O$_{19}$:Mn; LaPO$_4$:Ce, Tb; Zn$_2$SiO$_4$:Mn; CeMgAl$_{11}$O$_{19}$:Tb; and BaMgAl$_{10}$O$_{17}$:Eu, Mn, and, at least one or more types emitting red fluorescence and selected from a group consisting of cousin (CaAlSiN$_3$:Eu) which is pure nitride obtained by activating Eu (europium); (Sr, Ca)AlSiN$_3$:Eu; Y$_2$O$_2$S:Eu; Y$_2$O$_3$:Eu; Zn$_3$(PO$_4$)$_2$:Mn; (Y, Gd, Eu)BO$_3$; (Y, Gd, Eu)$_2$O$_3$; YVO$_4$:Eu; and La$_2$O$_2$S:Eu, Sm.

Fourth Embodiment

Figure 4:
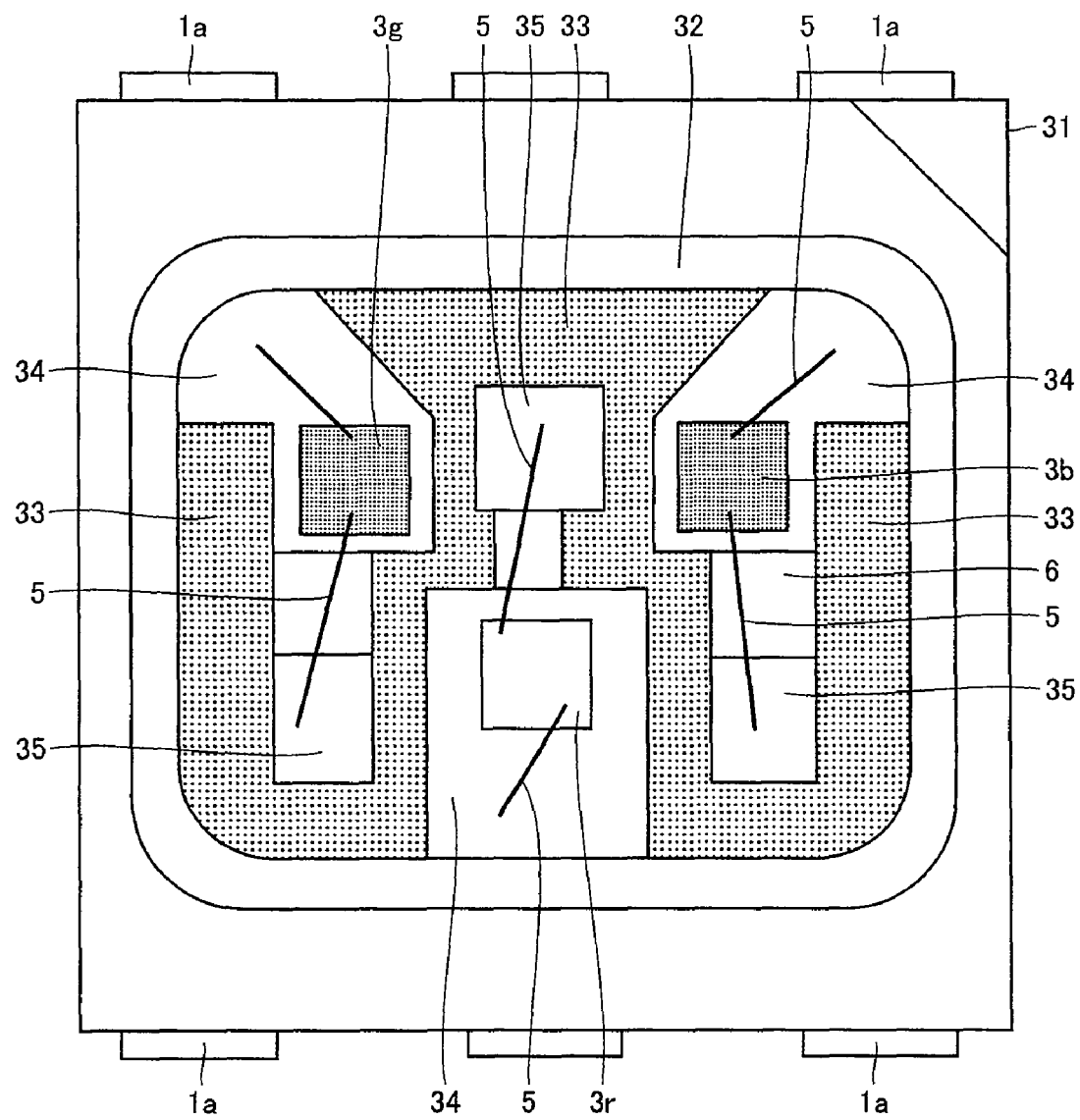
FIG. 4 is a plan view of a light emitting face of a semiconductor light emitting device according to a fourth embodiment of the present invention.

The semiconductor light emitting device according to the fourth embodiment of the present invention will be described with reference to FIG. 4. FIG. 4 is a plan view of a semiconductor light emitting device according to the fourth embodiment of the present invention. With regard to the semiconductor light emitting device according to the fourth embodiment of the present invention, the same components as those in the first embodiment are designated by the same reference characters, and description thereof will not be repeated. In FIG. 4, a red light emitting element 3r, a blue light emitting element 3b, a green light emitting element 3g, a convex resin portion 33, a conductive wire 5, an extraction electrode 34 as a metal member region, and an extraction electrode 35 are provided in a concave portion 32 of a package 31.

In FIG. 4, it appears that the area of each of extraction electrodes 34 and 35 on the bottom surface of concave portion 32 in package 31 is small. This is because convex resin portion 33 is formed so as to partially cover the upper surfaces of extraction electrodes 34 and 35. Accordingly, each of the areas of extraction electrodes 34 and 35 is the same irrespective of whether convex resin portion 33 is formed or not. The heat generated from each light emitting element is dissipated to the outside through extraction electrodes 34 and 35 as in the first to third embodiments.

Fifth Embodiment

Figure 5A:
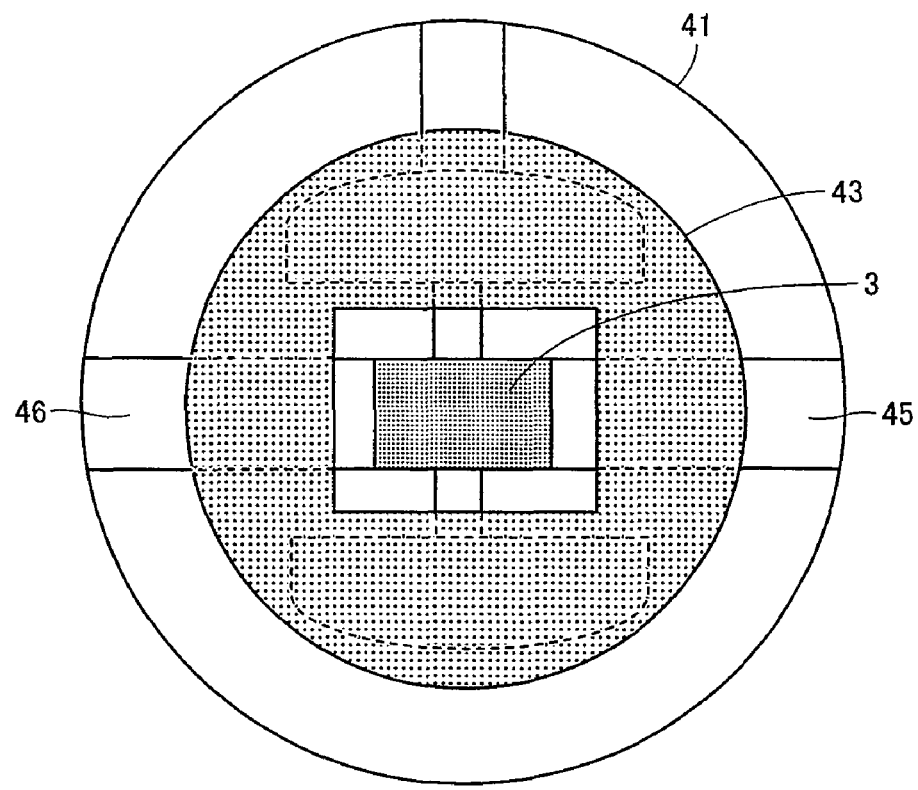
FIG. 5A is a plan view of a light emitting face of a semiconductor light emitting device according to a fifth embodiment of the present invention.
Figure 5B:
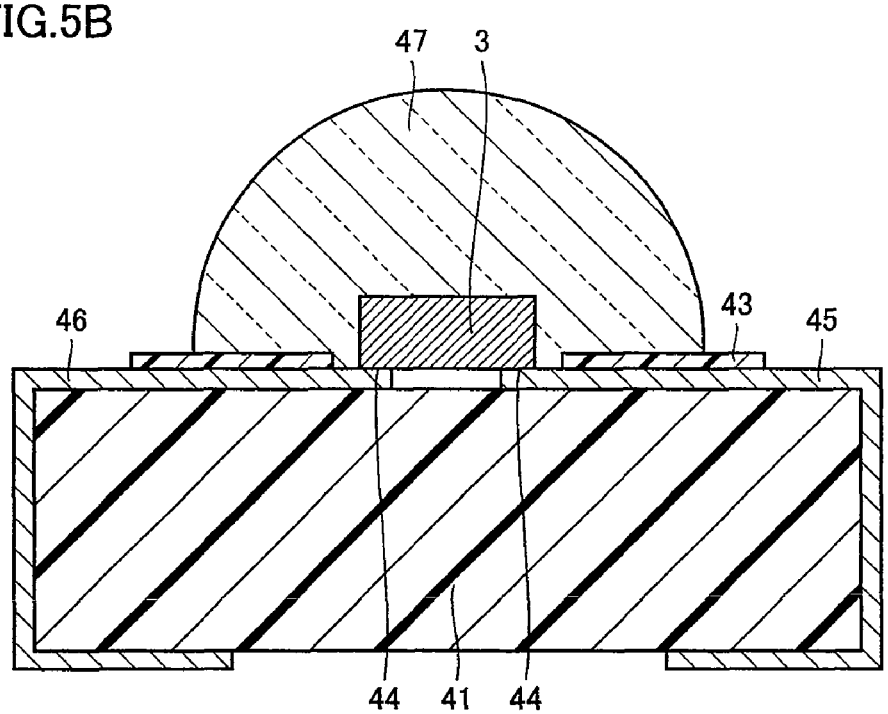
FIG. 5B is a cross sectional view of a semiconductor light emitting device according to the fifth embodiment.
Figure 6:
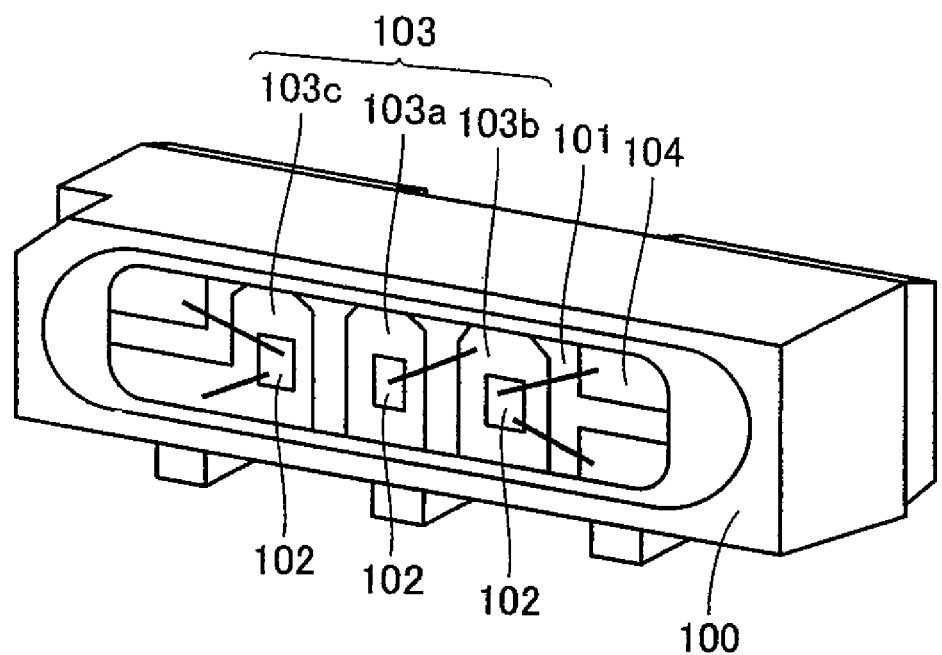
FIG. 6 is a perspective view of a conventional semiconductor light emitting device.

The semiconductor light emitting device according to the fifth embodiment of the present invention will be described with reference to FIGS. 5A and 5B. FIG. 5A is a front view of a semiconductor light emitting device according to the fifth embodiment of the present invention, and FIG. 5B is a cross sectional view of a semiconductor light emitting device according to the fifth embodiment. With regard to the semiconductor light emitting device according to the fifth embodiment of the present invention, the same components as those in the first embodiment are designated by the same reference characters, and description thereof will not be repeated. In FIGS. 5A and 5B, a light emitting element 3 having a blue light emitting element covered with phosphor, a convex resin portion 43, a conductive portion 44, and extraction electrodes 45 and 46 each as a metal member region are provided in a package 41. Light emitting element 3 is configured of a blue light emitting element covered with phosphor and has its upper portion covered with a sealing resin 47 in the form of a lens (approximately hemispherical shape).

In this case, it appears that the area of each of extraction electrodes 45 and 46 on the bottom surface of the concave portion in the package is small. This is because a covering resin 43 is formed so as to partially cover extraction electrodes 45 and 46. Accordingly, the heat generated from light emitting element 3 is dissipated to the outside through extraction electrodes 45 and 46.

Furthermore, according to the structure of the present embodiment, the exposed area in the metal portion (extraction electrodes 45, 46, and the like) is significantly decreased, and the area of contact is increased between sealing resin 47 in the form of a lens and convex resin portion 43 both exhibiting excellent adhesion, with the result that an excellent adhesion between sealing resin 47 and resin portion 43 is achieved. This leads to the solution of the problems such as that sealing resin 47 in the form of a lens falls off and is raised.

According to the present invention described in each of the above embodiments, it becomes possible to prevent the resin from falling off and the electrical short circuit from occurring in each of the side light-emitting type and top light-emitting type surface-mount light emitting devices when it is mounted to the circuit substrate and the like during manufacture of the device requiring a light emitting element. Accordingly, the semiconductor light emitting device of the present invention can be applied to the display device using an LED light emitting element.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor light emitting device comprising:
   a package;
   a light emitting element placed on a predetermined surface of said package;
   a metal member region provided on said predetermined surface of said package, said light emitting element being disposed on said metal member region;
   an extraction electrode provided on said predetermined surface of said package and connected by a wire with an electrode of said light emitting element;
   a convex resin portion provided on said predetermined surface of said package to separate said metal member region into a plurality of sections;
   a covering resin partially formed on said metal member region; and
   on said predetermined surface of said package, a sealing resin covering said metal member region, said covering resin and said convex resin portion,
   at least said convex resin portion and said covering resin being in contact with said sealing resin.

2. The semiconductor light emitting device according to claim 1, wherein said predetermined surface of said package is a bottom surface of a concave portion provided in said package.

3. The semiconductor light emitting device according to claim 2, wherein said covering resin is formed to continuously extend from an end of the bottom surface of said concave portion in said package.

4. The semiconductor light emitting device according to claim 1, wherein the metal member region on which said light emitting element is placed and said extraction electrode are silver-plated.

5. The semiconductor light emitting device according to claim 2, wherein an inner inclined surface of the concave portion in said package is subjected to mirror-finishing.

6. The semiconductor light emitting device according to claim 1, wherein said convex resin portion is absent below said wire electrically connecting said light emitting element and said extraction electrode.

7. The semiconductor light emitting device according to claim 1, wherein said covering resin is formed on a surface of said extraction electrode.

8. The semiconductor light emitting device according to claim 1, wherein resin forming said package and said covering resin are made of same material.

9. The semiconductor light emitting device according to claim 1, wherein mount surfaces of a plurality of said light emitting elements are separated by said convex resin portion.

10. The semiconductor light emitting device according to claim 1, wherein a plurality of said extraction electrodes are separated from each other by said convex resin portion.

11. The semiconductor light emitting device according to claim 1, wherein said covering resin is formed around a connection to said wire on said extraction electrode.

12. The semiconductor light emitting device according to claim 1, wherein the resin forming said package and said sealing resin comprise at least one selected from a group consisting of polyphthalamide (PPA), polycarbonate resin, polyphenylene sulfide (PPS), liquid crystal polymer (LCP), ABS resin, epoxy resin, phenol resin, acrylic resin, PBT resin, and silicone resin.

13. The semiconductor light emitting device according to claim 1, wherein said sealing resin is formed in a form of a lens to cover said convex resin portion and said covering resin.

14. The semiconductor light emitting device according to claim 5, wherein said mirror finishing is carried out by plating with aluminum or silver to provide a mirror finished surface.

15. The semiconductor light emitting device according to claim 1, wherein said sealing resin is made of transparent resin.

16. The semiconductor light emitting device according to claim 1, wherein said sealing resin is made of resin containing phosphor.

17. The semiconductor light emitting device according to claim 1, wherein said sealing resin is made of resin containing a diffusing agent.

18. The semiconductor light emitting device according to claim 1, wherein said sealing resin has an approximately hemispherical shape.

19. The semiconductor light emitting device according to claim 1, wherein said sealing resin has an approximately cylindrical shape.

* * * * *